United States Patent
Ding et al.

(10) Patent No.: US 11,401,410 B2
(45) Date of Patent: Aug. 2, 2022

(54) BLOCK COPOLYMER COMPOSITIONS, PREPREGS, AND LAMINATES MADE THEREFROM

(71) Applicant: Kraton Polymers LLC, Houston, TX (US)

(72) Inventors: Ruidong Ding, Houston, TX (US); Yaming Niu, Shanghai (CN); Bing Yang, Houston, TX (US); Xavier Muyldermans, Mont-Saint-Guibert (BE); Frank de Wit, Amsterdam (NL); Huixian Yang, Shanghai (CN)

(73) Assignee: KRATON POLYMERS LLC, Houston, TX (US)

( * ) Notice: Subject to any disclaimer, the term of this patent is extended or adjusted under 35 U.S.C. 154(b) by 156 days.

(21) Appl. No.: 16/864,406

(22) Filed: May 1, 2020

(65) Prior Publication Data

US 2020/0347219 A1  Nov. 5, 2020

Related U.S. Application Data

(60) Provisional application No. 63/002,575, filed on Mar. 31, 2020, provisional application No. 62/842,878, filed on May 3, 2019.

(51) Int. Cl.

| | |
|---|---|
| C08L 53/00 | (2006.01) |
| C08J 5/24 | (2006.01) |
| C09D 153/00 | (2006.01) |
| H05K 1/03 | (2006.01) |
| B32B 15/14 | (2006.01) |
| B32B 15/20 | (2006.01) |
| B32B 5/02 | (2006.01) |
| B32B 37/06 | (2006.01) |
| B32B 37/10 | (2006.01) |
| B32B 37/18 | (2006.01) |

(52) U.S. Cl.
CPC ............... *C08L 53/00* (2013.01); *B32B 5/02* (2013.01); *B32B 15/14* (2013.01); *B32B 15/20* (2013.01); *B32B 37/06* (2013.01); *B32B 37/10* (2013.01); *B32B 37/182* (2013.01); *C08J 5/24* (2013.01); *C09D 153/00* (2013.01); *H05K 1/0373* (2013.01); *B32B 2260/021* (2013.01); *B32B 2260/046* (2013.01); *B32B 2305/076* (2013.01); *B32B 2307/202* (2013.01); *B32B 2311/12* (2013.01); *B32B 2323/00* (2013.01); *B32B 2457/08* (2013.01); *C08L 2205/025* (2013.01); *C08L 2205/03* (2013.01); *H05K 2201/012* (2013.01)

(58) Field of Classification Search
CPC ..................................................... C08F 287/00
See application file for complete search history.

(56) References Cited

U.S. PATENT DOCUMENTS

| | | |
|---|---|---|
| 4,020,251 A | 4/1977 | Hsieh |
| 5,571,609 A | 11/1996 | St. Lawrence et al. |
| 6,071,836 A | 6/2000 | St. Lawrence et al. |
| 6,130,291 A | 10/2000 | Kennedy et al. |
| 6,165,563 A | 12/2000 | Chandran et al. |
| 6,512,056 B1 | 1/2003 | Kennedy et al. |
| 6,617,398 B2 | 9/2003 | Yegger et al. |
| 6,699,941 B1 | 3/2004 | Handlin et al. |
| 8,519,273 B2 | 8/2013 | Paul et al. |
| 8,632,874 B2 | 1/2014 | Paul et al. |
| 9,265,160 B2 | 2/2016 | Paul et al. |
| 2003/0050395 A1 | 3/2003 | Morishita et al. |
| 2005/0239930 A1 | 10/2005 | Clair et al. |
| 2008/0221261 A1 | 9/2008 | Amou et al. |
| 2014/0024278 A1 | 1/2014 | He et al. |

FOREIGN PATENT DOCUMENTS

| | | |
|---|---|---|
| GB | 2307238 A | 5/1997 |
| JP | H097427 A | 1/1997 |
| JP | H0974273 A | 3/1997 |
| WO | 02/31002 A1 | 4/2002 |
| WO | 2010067743 A1 | 6/2010 |

OTHER PUBLICATIONS

Lu, Chu-Hua, et al., Star block copolymer Through Nitroxide-Mediated Radical Polymerization From Polyhedral Oligomeric Silsequioxane (POSS) Core, Macromolecular Chemistry and Physics, 1339-1347, 2010.

*Primary Examiner* — Ian A Rummel

(57) ABSTRACT

A resin composition that allows production of laminated sheets excellent in heat resistance and processability is disclosed. The resin composition comprises: a) a block copolymer, where the block copolymer comprises at least one polymer block comprising polymerized acyclic conjugated diene units, such as butadiene units, and at least one polymer block containing units like a conjugated cyclic diene such as 1,3-cyclohexadiene or monomer units characterized by unit Tg above 100° C., b) a curing initiator, and c) optionally diene-based polymer selected from a polybutadiene polymer and the copolymer of butadiene with styrene or other styrenic monomers, c) optional additives comprising but not limited to a multi-functional co-curable additive, a diene based rubber, a halogenated or non halogenated flame retardant, an inorganic or organic filler or fiber, an antioxidant, a adhesion promotor, a film forming.

18 Claims, No Drawings

BLOCK COPOLYMER COMPOSITIONS, PREPREGS, AND LAMINATES MADE THEREFROM

RELATED APPLICATIONS

This application claims benefit to U.S. provisional application Ser. 62/842,878 with a filing date of May 3, 2019, and Ser. No. 63/002,575 with a filing date of Mar. 31, 2020, the entire disclosures are incorporated herein by reference.

FIELD

This disclosure relates to a low dissipation, low dielectric curable block copolymer compositions and products made therefrom, including copper clad laminates and printed circuit boards.

BACKGROUND

With the rapid advancement of electronic technology, high capacity computer systems and networks require high frequency signal transmission, with circuit substrates suitable for high frequency and high speed transmission. It is desirable for the circuit substrates to operate signal at high frequency and low transmission loss, e.g., dielectric loss, conductor loss, and radiation loss. Transmission loss weakens electrical signals and destroys signal reliability.

Printed circuit boards traditionally employ epoxy resin, which has relatively high dielectric constant and dielectric loss tangent. Epoxy resin can be used in conjunction with phenolic compounds, amines, or acid anhydride curing agents for improved properties.

It is still difficult for such resin compositions to achieve low dissipation factor. Polyphenylene ether resin (PPO or called polyphenylene oxide resin, PPO) has been used in laminate due to its low dissipation property, but its flame retardancy is still insufficient. Its high viscosity limit its molecular weight or its content in the formulation and it lacks crosslinkability. Telechelic vinyl functionalized low molecular weight PPO resins has been used in laminates due to its improved solubility and crosslinkability but the resulting dissipation factor is negatively impacted.

Styrene-butadiene-styrene block copolymers have been disclosed for use in printed circuit board compositions, e.g., block copolymers comprising 1,2-polybutadiene, polyisoprene, and their modified (hydroxyl-, methacrylate and carboxylate terminated) or post-reacted resins (epoxy-, maleic anhydride-, or urethane-modified) butadiene or isoprene resins for use in printed circuit boards. The described styrenic block copolymers are limited by the limited temperature performance of their rigid polystyrene block.

There is still a need for improved compositions with good processability, low solution viscosity, effective curing capabilities, high softening point temperature and low dissipation factor, low dielectric constant characteristics at high frequencies for use in dielectric compounds for copper clad laminates and printed circuit boards made therefrom.

SUMMARY

In one aspect, a low viscosity resin composition for the manufacture of a cured article or printed circuit board is disclosed. The resin composition comprises 5 to 99 wt. % of a block copolymer, wherein the block copolymer contains at least a A block and at least one of B, B' and C block. Each A block is a non hydrogenated poly(acyclic conjugated diene) polymer comprising polymerized units of at least one acyclic conjugated diene. Each B block is a poly(1,3-cyclodiene) homopolymer with GPC block Mp below 25 kg/mol. Each B' block is a poly(1,3-cyclodiene-co-monoalkenyl arene) copolymer with GPC block Mp below 30 kg/mol. Each C block is a poly(alkenyl arene) polymer or copolymer containing at least one high Tg alkenyl arene unit having Tg superior to 100° C. The block copolymer has: a GPC peak molecular weight Mp of less than 50,000 g/mol before coupling, a GPC peak molecular weight Mp multiplied by the A block content weight fraction is above 500 g/mol. The resin composition further comprises from 0.1 to 10 wt. % of a cure initiator; and up to 95 wt. % of one or more additives selected from a multi-functional co-curable additive, a diene based rubber, a halogenated or non halogenated flame retardant, an inorganic or organic filler or fiber, an antioxidant, a adhesion promotor, and a film forming polymer.

In another aspect, a prepreg, and a laminated sheet prepared from the resin composition is disclosed.

DESCRIPTION

The following terms will be used throughout the specification and will have the following meanings.

"One or more of" or "at least one of" when used to preface several elements or classes of elements such as X, Y and Z, is intended to refer to a single element selected from X or Y or Z, or a combination of elements such as X and Y, or Y and Z, or X and Z.

"Prepregs" refers to impregnated fabric obtained from impregnating a supporting or reinforcing fabric with a resin.

"Copper Clad Laminate" or "CCL" refers to a base material of printed circuit boards ("PCBs"), or circuit substrate. CCL is obtained via lamination with copper clad on either one side or both sides of reinforcing materials (e.g., fiberglass fabric) after being soaked in resin. In embodiments, CCL is obtained by laminating one or more layers of prepreg with, say, one or more layers of copper foil. The lamination is achieved by pressing together one or more plies of copper and prepreg under intense heat, pressure and vacuum conditions.

"Printed circuit board" can be obtained by etching the copper surfaces of the CCL to create an electronic circuit. The etched CCLs are assembled into a multilayer configuration with drilled and plated holes to establish electrical connections among the layers.

Terms "mono alkenyl arene" and "alkenyl aromatic" are used synonymously.

"High Tg unit(s)" refers to polymerized monomer units that if homopolymerized or copolymerized together into polymer of high molecular weight like 100,000 g/mol exhibiting a DSC glass transition temperature (Tg) above 100° C.

"Molecular weight" (MW) refers to the styrene equivalent molecular weight in kg/mol of the polymer block or the block copolymer. MW can be measured with gel permeation chromatography (GPC) using polystyrene calibration standards according to ASTM 5296-19. The chromatograph can be calibrated using commercially available polystyrene molecular weight standards. The styrene equivalent MW can be converted to true molecular weight when the styrene content of the polymer and the vinyl content of the diene segments are known. The detector can be a combination ultraviolet and refractive index detector.

"Peak molecular weight," Mp, or "GPC peak molecular weight," or "GPC Mp" refers to the MW measured at the peak of the GPC trace, unless otherwise specified. Molecular weights are styrene equivalent, as described above.

The disclosure relates to a resin composition comprising a block copolymer for use in the manufacture of prepregs and laminates, particularly for PCBs.

Block Copolymer Component:

A first component is a block copolymer. The block copolymer broadly comprises at least one non-hydrogenated poly(acyclic conjugated diene) block A comprising polymerized units of at least one acyclic conjugated diene, and at least one polymer block composed of high Tg units.

In embodiments, the high Tg block is selected from B, B', and C. The B block is a poly (1,3-cyclodiene) homopolymer. A non-limiting example of a 1,3-cyclodiene monomer is 1,3-cyclohexadiene (CHD). In embodiments, the B block has a GPC block Mp of <25 kg/mol, or <20 kg/mol, or <15 kg/mol, or <9 kg/mol, or >2 kg/mol.

The B' block is a poly (1,3-cyclodiene) random copolymer block. The random copolymer block can include one or more comonomer such as a mono-alkenyl arene, e.g., styrene or any mono-alkenyl arene described for the block C. In embodiments, the B block has a GPC block Mp of <30 kg/mol, or <25 kg/mol, or <20 kg/mol, or <9 kg/mol, and >2 kg/mol.

The C block is a poly(alkenyl arene) polymer or copolymer containing at least a high Tg mono-alkenyl arene units having Tg>100° C., or >125° C., or >150° C., or <250° C. In embodiments, the C block has a GPC block Mp of <20 kg/mol, or <15 kg/mol, or <10 kg/mol. Examples include ortho-methylstyrene, meta-methylstyrene, paramethylstyrene, alpha-methyl styrene, para-alpha dimethylstrene, vinyl-benzocyclobutene, vinyl biphenyl, adamantyl styrene, 1,1-diphenyl-ethylene, and benzofulvene.

In embodiments, the block copolymer has a general configuration A-B, (A-B-)$_n$X, A-B', (A-B-)$_n$X, A-B-A, A-B'-A, A-B-C, A-B'-C, A-C-B, A-C-B', (B-A-)$_n$X, (B'-A-)$_n$X, B-A-B, B'-A-B', (A-C-B-)$_n$X, (A-C-B'-)$_n$X, A-C-B-A, A-C-B'-A, A-C, A-C-A, (A-C-)$_n$X, where n is an integer from 2 to 50, and X is a coupling agent residue.

In embodiments, each A block is a non hydrogenated poly(acyclic conjugated diene) polymer comprising polymerized units of at least one acyclic conjugated diene. In embodiments, each A block is polybutadiene (PBd) block with less than 50 wt. % of 1,4 polymerized units. In embodiments, each B block is a poly(1,3-cyclodiene) homopolymer, each B' block is a poly(1,3-cyclodiene-co-monoalkenyl arene) copolymer. In embodiments, each C block is a poly(alkenyl arene) polymer or copolymer containing at least one high Tg alkenyl arene unit. Polymerization of a 1,3-cyclodiene unit CD monomer can occur both by a 1,2- and 1,4-addition mechanisms. Thus, with a CD monomer such as CHD (cyclohexadiene), the 1,4-addition produces a 1,4-disubstituted (akin to a para-disubstituted benzene ring) cyclohexane repeat unit (also referred to herein as "p-CHD" or "PCHD").

The block copolymers can be made via a method as disclosed in U.S. Pat. No. 6,699,941, or via alternative methods, as described in GB2307238B and U.S. Pat. No. 6,699,941, incorporated herein by reference. In embodiments, the microstructure or vinyl content (which in turn is dependent on the extent of 1,2-addition versus 1,4-addition of the diene unit) of the polymer blocks having polymerized CD and the acyclic conjugated diene units block can be controlled by varying the relative amount of the microstructure modifying agent, e.g., tetramethylethylenediamine (TMEDA), diethoxy propane (DEP), 1,4-diazabicyclo[2.2.2]octane (DABCO) for lower 1,4 addition units and thus for higher 'vinyl' contents. 1,2-Addition of a CD such as 1,3-cyclohexadiene leads to the formation of a 1,2-cyclohex-3-ene-diyl group on the polymer backbone, whereas 1,4-addition leads to the formation of a 1,4-cyclohex-2-ene-diyl group on the polymer backbone.

In embodiments, the block copolymer is prepared by contacting the monomers simultaneously or sequentially with an anionic polymerization initiator system such as n-BuLi, in a suitable solvent mixture, at a temperature from 25-70° C. for the first block, and at 25-50° C. for the second block. After the backbone of the block copolymer is essentially formed, the living block copolymer can either be coupled and terminated to provide the (coupled) di-block copolymer or can be extended with a third block (and coupled). The polymer may be isolated and recovered by precipitation and evaporation In embodiments before coupling, the block copolymer in embodiments has a GPC peak molecular weight Mp of <50 kg/mol, or <45 kg/mol, or <35 kg/mol, or >5 kg/mol.

After coupling in embodiments, the block copolymer has a GPC Mp multiplied by the A block content weight fraction of >500 g/mol, or >1 kg/mol, or >10 kg/mol, or <100 kg/mol.

In embodiments, the block copolymer contains less than 5 wt. %, or <4 wt. %, or >0.1 wt. % of atoms different from carbon and hydrogen.

The block copolymer in embodiments has a DSC Tg>100° C., or >110° C., or >125° C., or >175° C., or <250° C. The block copolymer in embodiments has a dielectric constant Dk at 1 gigahertz of <2.6, or <2.3, or <2.1, or >1.5; a dielectric loss factor Df at 1 gigahertz of <0.003, or <0.002, or <0.001, or >0.00001.

In embodiments, the block copolymer has a solution viscosity at 25 wt. % in toluene at 25° C. of <2000 mPa·s, or <1800 mPa·s, or <1,500 mPa·s, or >10 mPa·s; or a solution viscosity at 25° C. at 50 wt. % in xylene of <10,000 mPa·s, or <8,000 mPa·s, or <5,000 mPa·s, or >10 mPa·s.

The amount of block copolymer in the resin ranges from 5 to 99 wt. %, or 5 to 80, or >8 wt. %, or 10-30 wt. %, or <70 wt. %, of the total weight of the resin.

Curing Agent/Initiator:

The resin composition further comprises a radical generating compounds also referred as curing agent or curing initiator. Examples include, but are not limited to, azides, peroxides, sulfur, and sulfur derivatives. Free radical initiators are especially desirable as cure initiators. The radical generating compound also referred as curing catalyst is generating radicals at elevated temperature or under the triggering effect of UV or other energy addition. The radical generating compounds ensures the resin composition is processable at low temperature in absence of the UV or triggering energy but generate a high concentration of radicals at the activation temperature or under UV or the introduction of the triggering energy. The radical generating compound can include any compound capable of producing radicals at elevated temperature or after the addition of the triggering energy such as UV radiations.

Examples of radical generating compound is organic peroxide such 2,5-dimethyl-2,5-di(t-butylperoxy)-hex-3-yne, di-t-butylperoxide, t-butylcumyl peroxide, di(t-butylperoxy-isopropyl)benzene, 2,5-dimethyl-2,5-di(t-butylperoxy)hexane, dicumylperoxide, and the like. Typical non-peroxy initiators include compounds such as, for example, 2,3-dimethyl-2,3-diphenylbutane, 2,3-trimethylsilyloxy-2,3-diphenylbutane, and the like. Typical UV radical initiator is 2,2-Dimethoxy-1,2diphenylethan-1-one. In embodiments, the cure initiator is a peroxide with 1-hour half-life temperature of >120° C.

The curing initiator, when used, is present in an amount of 0.1-10 wt %, or 0.3 to 7 wt. %, or 1 to 5 wt. %, based on the total weight of the resin.

Additives: The resin composition may further comprise one or more additives comprising but not limited to a multi-functional co-curable additive, a diene based rubber, a halogenated or non-halogenated flame retardant, an inorganic or organic filler or fiber, mono vinyl compounds or other additives known in the art such as an antioxidant, a colorant or a stabilizers, an adhesion promotor, a toughened, a film forming additive, in amounts ranging from 0.1 to 50 wt. % of the resin composition.

Examples of multifunctional co-curable additives constituted by multivinyl compounds include low molecular weight divinylbenzene or bis(vinylphenyl)-ethane or divinylnaphthalene, trimethylolpropane trimethacrylate or trimethylolpropane triacrylate or triallylisocyanurate or triallylcyanurate or of mutivinyl compounds such as vinyl functionalized PPE (also referred as allyl modified polyphenylene ether) such as SA-9000 from Sabic, or OPE 2st from Mitsubishi Gas Chemical, or a diene based polymer, e.g., homopolymers of dienes, or copolymers (including triblock copolymers) of different alkenes and/or dienes, with a double bond in the polymer main chain. The diene-based polymer can be in liquid state or solid state at room temperature, including unsaturated resins for dielectric substrates such as a polybutadiene polymer, or the copolymer of butadiene with styrene or the like styrenic monomers.

Other additive examples include a polybutadiene rubber having a (meth)acryloyl group, a polyisoprene rubber having a (meth)acryloyl group, a copolymer rubber of butadiene and isoprene having a (meth)acryloyl group, a copolymer rubber of butadiene and n-butene having a (meth)acryloyl group, and the like. In embodiments, the diene-based polymer is selected from polybutadiene, polyisoprene, butadiene-styrene copolymers, isoprene-styrene copolymers, triblock copolymers of butadiene-styrene-methacrylate, butadiene-styrene-divinylbenzene, butadiene-styrene-acrylonitrile copolymer, butadiene-styrene-maleic anhydride copolymer and any combination thereof.

Examples of liquid butadiene copolymers are butadiene-co-styrene and butadiene-co-acrylonitrile. The unsaturated butadiene- or isoprene-containing polymer may also contain a second block copolymer similar to the first, except that the polybutadiene or polyisoprene block is hydrogenated, thereby forming a polyethylene block (in the case of polybutadiene) or an ethylene-propylene copolymer (in the case of polyisoprene).

A second category of multifunctional co-curable additive is constituted by non-vinyl olefinic compounds such as bismaleimide resins like 4,4'-bis(maleimido)-diphenylmethane In some embodiments, the co-curable additive is an unhydrogenated block copolymer, having a peak molecular weight of 20,000 to 200,000 atomic mass units. The peak molecular weight can be determined by gel permeation chromatography (GPC) and based on polystyrene standards, corresponding to the polystyrene molecular weight that would generate the same peak maximum value as the measured polymer.

Flame Retardants: In embodiments, the resin composition further comprises flame retardant selected from phosphorous-containing flame retardants and brominated flame retardants. Examples of brominated flame retardant include ethylene-bis(tetrabromophthalimide), 1,2-bis(pentabromophenyl) ethane, and 2,4,6-tris(2,4,6-tribromophenoxy)-1,3,5-triazine. Examples of phosphorous-containing flame retardants include bisphenol diphenyl phosphate, ammonium polyphosphate, hydroquinone bis-(diphenyl phosphate), bisphenol A bis-(diphenylphosphate), tri(2-carboxyethyl)phosphine (TCEP), tri (chloroisopropyl) phosphate, trimethyl phosphate (TMP), dimethyl methyl phosphonate (DMMP), resorcinol bis(dixylenyl phosphate), phosphazene, melamine polyphosphate, 9,10-dihydro-9-oxa-10-phosphaphenanthrene-10-oxide (DOPO) and its derivative or resin, melamine cyanurate and tri-hydroxy ethyl isocyanurate. In embodiments, the flame retardant compound may be a DOPO compound, DOPO resin (e.g. DOPO-HQ, DOPO-NQ, DOPO-PN, and DOPO-BPN), and DOPO-containing epoxy resin, wherein DOPO-BPN may be bisphenol novolac compounds such as DOPO-BPAN, DOPO-BPFN, and DOPO-BPSN.

In embodiments, the flame retardant a non-reactive flame retardant, which does not contain a reactive functional group in its chemical structure.

Flame retardant is typically present in amounts ranging from 5 to 25 wt. %, or 8 to 20 wt. %, or at least 10 wt. %, based on the total weight of the resin.

Fillers:

The resin composition further comprises at least an inorganic and/or organic filler. Inorganic filler can be used for suppressing the thermal expansion coefficient and improving the toughness of the laminated sheets. Organic fillers can be used to reduce the dielectric constant of laminated sheets.

Exemplary fillers include titanium dioxide (rutile and anatase), barium titanate, strontium titanate, silica, including fused amorphous silica, corundum, wollastonite, aramide fibers, fiberglass, $Ba_2Ti_9O_{20}$, glass spheres, quartz, boron nitride, aluminum nitride, silicon carbide, beryllia, alumina, magnesia, magnesium hydroxide, melamine polyphosphate, melamine cyanurate, Melam, Melon, Melem, guanidines, phosphazanes, silazanes, DOPO (9,10-dihydro-9-oxa-10 phosphenathrene-10-oxide), DOPO (10-5 dihydroxyphenyl, 10-H-9 oxaphosphaphenanthrenelo-oxide), mica, talcs, nanoclays, aluminosilicates (natural and synthetic), and fumed silicon dioxide, used alone or in combination. The filler can be surface treated to make its surface non hydroscopic and more compatible with other ingredients of the composition or reactive towards radicals. Such surface treatment encompass treatment with organosilane coupling agents such as vinyl silanes or alkyl silanes or aryl silanes.

Examples of organic fillers include fluorine-based, polystyrene-based, divinylbenzene-based, and polyimide-based fillers. Fluorine-based fillers include polytetrafluoroethylene (PTFE), polyperfluoroalkoxy resins, polyethylenefluoride-propylene resins, polytetrafluoroethylene-polyethylene copolymers, polyvinylidene fluoride, polychlorotrifluoroethylene resins or the like.

In embodiments, the filler can be treated with one or more coupling agents, such as silanes, zirconates, or titanates. The filler can be pretreated, or the coupling agent can be added to the resin composition.

The amount of fillers ranges up to 60 wt. %, or up to 75 wt. %, or from 5 to 50 wt. %, or at least 20 wt. % of the resin.

Optional Adhesion Promoting Polymers:

The resin composition may optionally include a polymer added to increase the adhesion to the copper foil, e.g., a poly(arylene ether), a functionalized hydrogenated styrenic block copolymer.

In embodiments, the adhesion promoting polymer is selected from a carboxyl-functionalized poly(arylene ether), a styrene-ethylene/butylene-styrene (SEBS) functionalized with maleic anhydride or an hydrogenated block copolymer with a block composed of hydrogenated form of a copolymer of conjugated diene with styrene such as Kraton A from Kraton Polymers.

Optional mono vinyl compounds such as styrene, alphamethylstrene, paramethylstyrene, bromostyrene, dibromostyrene can also be used.

If present, the adhesion promotion polymer can be added in amounts of up to 20 wt. %, or up to 20 wt. % or from 3-15 wt. %; or from 5 to 10 wt. % of the resin.

Solvent:

In manufacturing, solvent can be added to change the solid content of the resin composition and to adjust the viscosity of the resin composition. Suitable solvents include, for example, ketones such as methylethylketone or the like, ethers such as dibutylether or the like, esters such as ethyl acetate or the like, amides such as dimethylformamide or the like, aromatic hydrocarbons such as benzene, toluene, xylene or the like, and chlorinated hydrocarbons such as trichloroethylene or the like; each solvent can be used alone or in combination thereof.

Preferred solvents are selected from the group of methanol, ethanol, ethylene glycol methyl ether, acetone, methyl ethyl ketone, methyl isobutyl ketone, cyclohexanone, toluene, xylene, methoxyethyl acetate, ethoxyethyl acetate, propoxyethyl acetate, ethyl acetate, dimethylformamide, propylene glycol methyl ether, gamma-butyrolactone (GBL) and diisobutyl ketone (DIBK).

The amount of solvent used is dependent on the solubility of the components, the filler amount, the method of application, and other factors. In embodiments, the solvent comprises 10 to 50 wt. % solids, or 15 to 40 wt. % solids, based on the total combined weight of the solution and solids.

Other Optional Components: In embodiments, the low dissipation factor resin composition may be further added with at least one of the following additives: coupling agent, surfactant, toughener, viscosity modifiers, wetting agents, antioxidants, colorant and the like.

The choice of additives depends upon the application, and the desired properties, selected so as to enhance or not substantially adversely affect the electrical properties of the circuit subassemblies, such as dielectric constant, dissipation factor, dielectric loss, and/or other desired properties. Curing accelerator is added to increase the reaction rate of the resin composition. Surfactant helps ensure uniform distribution of the inorganic filler in the resin composition and to avoid aggregation of the inorganic filler. Toughener helps improve the toughness of the resin composition.

The toughener may be rubber resin, carboxyl-terminated polybutadiene acrylonitrile, and/or core-shell polymer. Exemplary antioxidants include radical scavengers and metal deactivators. Coupling agents can be present to promote the formation of or participate in covalent bonds connecting a metal surface or filler surface with a polymer. Exemplary coupling agents include 3-mercaptopropylmethyldimethoxy silane and 3-mercaptopropyltrimethoxy silane and hexamethylenedisilazanes.

The coupling agent may be silane and/or siloxane compound. For example, an amino silane compound, an amino siloxane compound, a styrene-based silane compound, a styrene-based siloxane compound, an acrylic silane compound, an acrylic siloxane compound, a methacrylic silane compound, a methacrylic siloxane compound, a vinyl silane, an alkyl silane compound and an alkyl siloxane compound.

In embodiments, the resin further comprises an adhesion promoter known in the art, e.g., a metal adhesion promoter such as N-containing heterocycles, which can form complex with the metal foil, thus enhancing the adhesion between the foil and the resin layer, in an amount of 0.1 to 2 wt. % of the total resin composition. In embodiment, instead of being added to the resin composition, the adhesion promoter is applied to the resistive metal layer in the form of a solution or a dispersion in water or an organic solvent.

In embodiments, the resin further comprises up to 15 wt. % of an adhesion promoting polymer selected from a poly(arylene ether), a carboxy-functionalized poly(arylene ether), and a styrene-ethylene/butylene-styrene (SEBS) functionalized with maleic anhydride. In embodiments, a curable composition is formed with the copolymer, a curing initiator selected from sulfur curing agents and peroxides curing agents, and a diene based rubber as a co-curing additive.

The resin can contain additional soluble polymer such as polyphenylene oxide resins, polyolefins, styrenic polymers, styrenic block copolymer or hydrogenated styrenic block copolymers, high Tg hydrocarbon polycycloolefin. Those polymers are used in low amount to modify the resin and improve its film forming ability, its impact resistance, its Tg, its processing characteristics.

In embodiments if used for applications other than CCL, the resin can contain diene rubbers to form tire compounds. In this case, the block copolymer of this invention is behaving as a curable reinforcing resin once cured in the rubbery composition.

Depending on the additives, the amount of optional components can range from 0.1-25 wt. %, or >0.2 wt. %, or >0.5 wt. %, or <10 wt. %, or <15 wt. % of the total weight of the resin.

Applications: The resin composition is suitable for use in laminates, e.g., copper clad laminates, for printed circuit boards, produced by impregnating a substrate or reinforcing material (e.g., glass based fiber, woven fabric, cross-ply laminate) with the resin, followed by the resin being cured partially or wholly forming prepregs. To make laminates, one or more layers of prepregs are laminated with one or more layers of copper. The printed circuit boards can be used in many high frequency and high data speed electrical and electronics application, particularly with a dissipation factor of less than 0.006.

The block copolymer for use in the resin composition can also be used in other cured applications requiring high temperature performance like adhesives, coatings, encapsulating resin for LEDs, resin for radome, cured rubber application like rubber compounds in tire treads, and additive for other resins.

Process for Making:

In one method for the making of high-frequency CCL or circuit substrate, the components as previously described are combined, including the block copolymer, the cure initiator and optional components like multifunctional co-curable agent like a diene-based polymer, a flame retardant, and other optional components. The resin mixture is diluted to an appropriate viscosity with a solvent, e.g., toluene, xylene, MEK, and mixtures thereof, forming a glue solution or a varnish. A reinforcing material or substrate, e.g., fiber, glass felt, wood pulp paper, a fiberglass cloth (optionally already processed with a coupling agent) is impregnated with the glue solution to a desired thickness. Solvent is then removed from the impregnated fiberglass via solvent evaporation cloth forming prepregs.

In embodiments, the prepegs are formed by evaporating the solvent at a temperatures below the activating temperature of the cure initiator, or for a sufficient period of time to evaporate the solvent but without reaching the gel time. Gel time refers to the time from when the material begins to soften until gelation occurs, where gelation is the irreversible transformation from a viscous liquid to an elastic gel. In embodiments, prepegs are formed by impregnating the resin into a substrate, e.g., a fiber article, and semi-curing the resulting impregnated substrate or heat-pressing together the coated fiber with or without additional resin composition.

Next, the prepregs are laminated with copper foil in between and cured at a temperatures between 150 to 250° C. and pressure of 20 Kg/cm$^2$ to 70 Kg/cm$^2$, thereby forming circuit substrate.

Properties of Resin Composition:

The resin composition is characterized as have a low dielectric loss, in particular a dissipation factor Df of less than or equal to 0.02, less than or equal to 0.006, or less than or equal to 0.003, all measured at 1 or 10 gigahertz.

The resin composition is characterized as have a low dielectric constant Dk, in particular a dielectric constant of less than or equal to 4.4, less than or equal to 3.8, or less than or equal to 3.4, all measured at 1 or 10 gigahertz. The above-described dielectric materials also have a low CTE (coefficient of thermal expansion), of less than or equal to 80 ppm/° C., less than or equal to 60 ppm/° C., or less than or equal to 50 ppm/° C., all measured over 0 to 150° C.

The resin composition also has good thermal conductivity, on the order of 0.2 to 0.7 Watts per meter-Kelvin (W/mK), or 0.3 to 0.5 W/mK.

The resin compositions can further have low moisture absorption, which results in a package substrate that is less sensitive to environmental conditions both in use and during storage. In one embodiment, the moisture absorption is 0.05-0.3 percent after immersion in water at 23° C. for 24 hours.

The resin composition can attain a UL 94 rating of V-0, or at least V-1, or at least V-2 rating. In one embodiment, the V-0 rating is obtained in the absence of brominated or chlorinated flame retardants.

The resin composition is also curable, meaning that after curing the composition leads to >15%, or >30%, or >50% gel formation. After curing, the resin composition is characterized as having a swelling ratio of <20, <10, or <5, or <2, or <1.5. The swelling ratio is defined as the ratio between the swollen gel weight in an excess of solvent and the dried gel weight. The cured resin composition is also characterized as having a Tg of >100° C., or >110° C., or >120° C., or >150° C., or <250° C.

EXAMPLES

The following illustrative examples are intended to be non-limiting. The following ingredients were used in the examples:

DCP: Dicumyl peroxide

B3000: liquid polybutadiene of Mn 3200 g/mol and <10% 1,4 unit content.

TAIC: Triallyl Isocyanurate

Block copolymer 1 is a coupled block copolymer PBd-PCHD-PBd and prepared as follows: In a stainless dried steel reactor, 1 liter of purified and dried cyclohexane solvent was charged, 14.2 ml of n-Buli 1.6 molar was added followed by 3.3 gr of TMEDA. The solution was heated to reach 40° C. and 4.6 g of purified 1,3 butadiene monomer was added. The reaction was allowed to proceed for 45 minutes and a first small sample was collected from the solution for GPC analysis and NMR. The NMR confirmed the complete polymerization of this first monomer. 90 g of purified 1,3,cyclohexadiene was then added to the solution and allowed to polymerize for 45 minutes. A second small sample was collected from the solution for GPC and NMR analyses. The NMR confirmed the near complete polymerization of the second monomer. Then, another 4.5 g of purified 1,3 butadiene monomer was added. The reaction was allowed to proceed for 60 minutes. A third sample was collected for GPC analysis and NMR analyses. The NMR confirmed the near complete polymerization of the third monomer. The living solution was then killed by the addition of methanol. The polymer solution was stabilized with an anti-oxidant and the sample was isolated via precipitation in excess alcohol and dried at elevated temperature under vacuum. The GPC calibrated with polystyrene led, for the three respective collected samples, to main peak molecular weight of Mp=730 g/mol; Mp=8150 g/mol and Mp=8760 g/mol. The NMR analysis of the final product led to 35 wt. % content of 1,4 units and 65 wt. % content of 1,2 units in the polybutadiene blocks.

Block copolymer 2 is a block copolymer PCHD-PBd prepared as follows: In a stainless dried steel reactor, 6 liter of purified and dried cyclohexane solvent was charged, and 40 ml of sec-Buli 1.3 molar was added. The solution was heated to 35° C. and 800 g of purified 1,3 cyclohexadiene was then added to the solution with DEP and allowed to polymerize for 120 minutes. A first small sample was collected from the solution for GPC and NMR analyses. The NMR confirmed the near complete polymerization of the first monomer. Further 200 g of purified 1,3 butadiene monomer was added. The reaction was allowed to proceed for 90 minutes. A second sample was collected for GPC analysis and NMR analyses. The NMR confirmed the near complete polymerization of the second monomer. The living solution was then killed by the addition of methanol. The polymer solution was stabilized with an anti-oxidant, precipitated in excess alcohol and dried at elevated temperature under vacuum. The GPC calibrated with polystyrene led, for the two collected samples, to main peak molecular weight of Mp=21700 g/mol and Mp=34300 g/mol. The NMR analysis of the final product led to 24 wt. % content of 1,4 units and 76 wt. % content of 1,2 units in the polybutadiene block.

The GPC block molecular weight Mp or block ΔMp is calculated as the difference between the GPC peak molecular weight of the linear copolymer measured at the completion of the considered block and the GPC peak molecular weight of the same linear polymer measured just before the polymerization of the considered block. The GPC is calibrated with polystyrene standards, and the Mp values are thus expressed in polystyrene equivalent molecular weight.

Table 1 and 2 are summarize description & properties of the block copolymers used in the example.

TABLE 1

|  |  | Blocks structure | | | | | |
| --- | --- | --- | --- | --- | --- | --- | --- |
|  |  | Blocks weight ratio wt. % | GPC block1 ΔMp kg/mol | GPC block2 ΔMp kg/mol | GPC block3 ΔMp kg/mol | Mp*A weight fraction g/mol | Polybutadiene 1,4 units content Wt. % |
| Block copolymer1 | A-B-A | 4.8-91.2-4 | 0.73 | 7.42 | 0.61* | 771 | 35 |
| Block copolymer2 | B-A | 80-20 | 21.7 | 12.6 | — | 6860 | 24 |

TABLE 2

|  | DSC Tg °C. | Solubility at 50 wt. % in Xylene at 25° C. | S.V. 25% w in Toluene at 25° C. - mPa · s | S.V. 35% w in Toluene at 25° C. mPa · s |
| --- | --- | --- | --- | --- |
| Block copolymer1 | 103 | — | — | 4246 |
| Block copolymer2 | 134 | — | 104 | 448 |

Examples 1-6

The materials described above were used in amounts in Table 3. Properties of the composition after drying & curing (180° C. for 1 hr.) are also shown.

TABLE 3

|  | Units | Ex1 | Ex2 | Ex3 | Ex4 | Ex5 | Ex6 |
| --- | --- | --- | --- | --- | --- | --- | --- |
| Block copolymer1 | part | 100 | 90 | — | — | — | — |
| Block copolymer2 | part | — | — | 100 | 70 | 100 | — |
| DCP | part | 6 | 6 | 1 | 3 | — | 3 |
| B3000 | part | — | 10 | — | 30 | — | 100 |
| TAIC | part | — | — | — | 0.45 | — | — |
|  | part | — | — | — | — | — | — |
| Curing T/Cure time | ° C./min | 180/60 | 180/60 | 180/60 | 180/60 | 180/60 | 180/60 |
| Cured Tg | ° C. | 137 | 136 | 124 | 157 | 135 | <100 |
| Gel content | Wt. % | 57 | 67 | 15 | 72 | no | — |
| Swelling ratio |  | 6.8 | 5.5 | — | 5.7 | — | — |

Example 5 shows that the absence of cure initiator does not allow the block copolymer to be effectively cured with a curing cycle of 60 minutes at 180° C. An effective curing leads to a significant gel content and that gel has a swelling ratio not too high. Example 5 does not cure properly (with gel content around 0%). Example 6 does not have a sufficient Tg before and after curing.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained. It is noted that, as used in this specification and the appended claims, the singular forms "a," "an," and "the," include plural references unless expressly and unequivocally limited to one referent. As used herein, the term "include" and its grammatical variants are intended to be non-limiting, such that recitation of items in a list is not to the exclusion of other like items that can be substituted or added to the listed items.

As used herein, the term "comprising" means including elements or steps that are identified following that term, but any such elements or steps are not exhaustive, and an embodiment can include other elements or steps. Although the terms "comprising" and "including" have been used herein to describe various aspects, the terms "consisting essentially of" and "consisting of" can be used in place of "comprising" and "including" to provide for more specific aspects of the disclosure and are also disclosed.

Unless otherwise specified, all technical and scientific terms used herein have the same meanings as commonly understood by one of skill in the art to which the disclosed disclosure belongs. the recitation of a genus of elements, materials or other components, from which an individual component or mixture of components can be selected, is intended to include all possible sub-generic combinations of the listed components and mixtures thereof.

The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims. To an extent not inconsistent herewith, all citations referred to herein are hereby incorporated by reference.

The invention claimed is:
1. A curable resin composition comprising:
(a) 5 to 99 wt. % of a block copolymer, wherein the block copolymer contains at least an A block and at least one of B, B', and C block;
wherein each A block is a non hydrogenated poly(acyclic conjugated diene) polymer comprising polymerized units of at least one acyclic conjugated diene;
   each B block is a poly(1,3-cyclodiene) homopolymer with a GPC block molecular weight Mp of <25 kg/mol,
   each B' block is a poly(1,3-cyclodiene-co-monoalkenyl arene) copolymer with a GPC block molecular weight Mp of <30 kg/mol,
   each C block is a poly(alkenyl arene) polymer or copolymer containing at least one high Tg alkenyl arene unit having a Tg of >100° C., and
   the block copolymer has a GPC peak molecular weight Mp of <50 kg/mol before coupling;
   the block copolymer has a GPC peak molecular weight Mp multiplied by the A block content weight fraction of >500 g/mol;
(b) from 0.1 to 10 wt. % of a cure initiator; and
c) up to 95 wt. % of one or more additives selected from a multi-functional co-curable additive, a diene based rubber, a halogenated or non halogenated flame retardant, an inorganic or organic filler or fiber, an antioxidant, a adhesion promotor, and a film forming polymer;
wherein the curable resin composition after curing has a gel content of >15%.

2. The curable resin composition of claim 1, wherein the block copolymer has a GPC peak molecular weight Mp of <35 kg/mol before coupling.

3. The curable resin composition of claim 1, wherein the block copolymer (a) contains less than 5 wt. % of atoms different from carbon and hydrogen.

4. The curable resin composition of claim 1, wherein the block copolymer (a) has a DSC Tg>100° C.; and a solution viscosity at 25 wt. % in toluene at 25° C. of <2000 mPa·s.

5. The curable resin composition of claim 1, wherein
each A block is a polybutadiene block with <50 wt. % of 1, 4 polymerized units;
the B and B' blocks each independently has a GPC block molecular weight Mp of <9 kg/mol; and
the C block has a GPC block molecular weight Mp of <20 kg/mol.

6. The curable resin composition of claim 1, wherein:
the cure initiator (b) is a peroxide having a 1-hour half-life temperature of >120° C.; and
the one or more additives is a multi-functional co-curable selected from DVB, BVPE, TAC, TAIC, vinyl functionalized PPE resin, bismaleimide resin, diene-based polymer in liquid state or solid state at room temperature;
wherein the diene-based polymer is selected from polybutadienes, polyisoprenes, butadiene-styrene copolymers, isoprene-styrene copolymers, tri-block copolymers of butadiene-styrene-methacrylate, butadiene-styrene-divinylbenzene, butadiene-styrene-acrylonitrile copolymers, butadiene-styrene-maleic anhydride copolymers and combinations thereof.

7. The curable resin composition of claim 1, wherein the block copolymer (a) has a solution viscosity at 25° C. at 50 wt. % in xylene of less than 10,000 mPa·s, a dielectric constant Dk at 1 gigahertz of <2.6, and a dielectric loss factor Df at 1 gigahertz of <0.003.

8. The curable resin composition of claim 1, further comprising up to 15 wt. % of an adhesion promoting polymer selected from a poly(arylene ether), a carboxy-functionalized poly(arylene ether), and a styrene-ethylene/butylene-styrene (SEBS) functionalized with maleic anhydride.

9. A prepreg formed by:
(A) coating a substrate with a solution obtained by dissolving from 5 wt. % to up to 90 wt. % of the curable resin composition to of claim 1 in a solvent, and evaporating the solvent forming a coated substrate;
or
(B) impregnating the curable resin composition of claim 1, into a substrate forming an impregnated substrate, and heat-pressing the impregnated substrate with or without additional curable resin composition; and
forming the prepreg.

10. The prepreg of claim 9, wherein in the step (A) the solvent is selected from toluene, xylene, MEK, and mixtures thereof, and wherein the solvent is evaporated from the coated substrate at a temperatures below the activating temperature of the cure initiator (b) in the curable resin composition, or for a sufficient amount of time to limit the curing at a level not reaching gel time, forming the coated substrate.

11. A laminated sheet prepared by layering the prepreg of claim 9 with at least a layer of copper foil on at least a surface of the prepreg under heat-pressing conditions.

12. A copper clad laminate comprising the laminated sheet of claim 11.

13. A printed circuit board comprising the copper clad laminate of claim 12.

14. A product comprising the curable resin of claim 1.

15. A curable resin composition comprising:
(a) 5 to 99 wt. % of a block copolymer, wherein the block copolymer contains at least an A block and at least one of B, B', and C block;
wherein each A block is a non hydrogenated poly(acyclic conjugated diene) polymer comprising polymerized units of at least one acyclic conjugated diene;
   each B block is a poly(1,3-cyclodiene) homopolymer with a GPC block molecular weight Mp of <25 kg/mol,
   each B' block is a poly(1,3-cyclodiene-co-monoalkenyl arene) copolymer with a GPC block molecular weight Mp of <30 kg/mol,
   each C block is a poly(alkenyl arene) polymer or copolymer containing at least one high Tg alkenyl arene unit having a Tg of >100° C., and
   the block copolymer has a GPC peak molecular weight Mp of <50 kg/mol before coupling;
   the block copolymer has a GPC peak molecular weight Mp multiplied by the A block content weight fraction of >500 g/mol;
(b) from 0.1 to 10 wt. % of a cure initiator; and
(c) up to 95 wt. % of one or more additives selected from a multi-functional co-curable additive, a diene based rubber, a halogenated or non halogenated flame retardant, an inorganic or organic filler or fiber, an antioxidant, a adhesion promotor, and a film forming polymer;
wherein the block copolymer has a structure selected from any of: A-B, (A-B-)$_n$X, A-B', (A-B'-)$_n$X, A-B-A, A-B'-A, A-B-C, A-B'-C, A-C-B, A-C-B', (B-A-)$_n$X, (B'-A-)$_n$X, B-A-B, B'-A-B', (A-C-B-)$_n$X, (A-C-B'-)$_n$X, A-C-B-A, A-C-B'-A, A-C, A-C-A, and (A-C-)$_n$X;
n is an integer from 2 to 50 and X is a coupling agent residue.

16. A circuit subassembly, comprising:
a conductive metal layer,
a substrate coated with a curable resin composition, wherein the curable resin composition comprises:

(a) 5 to 99 wt. % of a block copolymer, wherein the block copolymer contains at least an A block and at least one of B or B' or C block;

wherein each A block is a non hydrogenated poly(acyclic conjugated diene) polymer comprising polymerized units of at least one acyclic conjugated diene;

each B block is a poly(1,3-cyclodiene) homopolymer with a GPC block molecular weight Mp of <25 kg/mol, each B' block is a poly(1,3-cyclodiene-co-monoalkenyl arene) copolymer with a GPC block molecular weight Mp of <30 kg/mol, each C block is a poly(alkenyl arene) polymer or copolymer containing at least one high Tg alkenyl arene unit having a Tg of >100° C., and the block copolymer has a GPC peak molecular weight Mp of <50 kg/mol before coupling;

the block copolymer has a GPC peak molecular weight Mp multiplied by the A block content weight fraction of >500 g/mol;

(b) from 0.1 to 10 wt. % of a cure initiator; and (c) up to 95 wt. % of one or more additives selected from a multi-functional co-curable additive, a diene based rubber, a halogenated or non halogenated flame retardant, an inorganic or organic filler or fiber, an antioxidant, a adhesion promotor, and a film forming polymer;

wherein the curable resin composition after curing has a gel content of >15%; and wherein the circuit subassembly has a dissipation factor (Df) of less than 0.006 at 10 GHz and a dielectric constant (Dk) of less than 3.8 at 10 GHz.

17. The circuit subassembly of claim 16, wherein the block copolymer (a) in the curable resin has a structure selected from any of: A-B, (A-B-)$_n$X, A-B', (A-B'-)$_n$X, A-B-A, A-B'-A, A-B-C, A-B'-C, A-C-B, A-C-B', (B-A-)$_n$X, (B'-A-)$_n$X, B-A-B, B'-A-B', (A-C-B-)$_n$X, (A-C-B'-)$_n$X, A-C-B-A, A-C-B'-A, A-C, A-C-A, and (A-C-)$_n$X; n is an integer from 2 to 50 and X is a coupling agent residue.

18. The circuit subassembly of claim 16, wherein the block copolymer (a) in the curable resin has a DSC Tg>100° C.; and a solution viscosity at 25 wt. % in toluene at 25° C. of <2000 cP.

* * * * *